United States Patent [19]

Hartig

[11] 4,063,107
[45] Dec. 13, 1977

[54] METHOD AND APPARATUS FOR PRODUCING INTERFERENCE-FREE PULSES

[76] Inventor: Gunter Hartig, Hansastrasse 29, 7500 Karlsruhe 21, Germany

[21] Appl. No.: 585,902

[22] Filed: June 11, 1975

Related U.S. Application Data

[62] Division of Ser. No. 418,794, Nov. 23, 1973, abandoned.

[30] Foreign Application Priority Data

Dec. 5, 1972 Switzerland ............... 17686/72

[51] Int. Cl.$^2$ .............................................. H03K 3/00
[52] U.S. Cl. ...................................... 307/106; 328/162
[58] Field of Search ................ 328/162; 307/106, 107; 360/40, 45, 51, 110, 111; 325/474

[56] References Cited

U.S. PATENT DOCUMENTS

| | | | |
|---|---|---|---|
| 2,822,533 | 2/1958 | Duinker et al. | 360/111 |
| 3,020,526 | 2/1962 | Ridler et al. | 360/40 |
| 3,049,698 | 8/1962 | Thompson et al. | 360/45 |
| 3,271,750 | 9/1966 | Padalino | 360/45 |
| 3,421,089 | 1/1969 | Lyghounis | 325/474 |
| 3,444,331 | 5/1969 | Brown, Jr. | 360/111 |
| 3,444,332 | 5/1969 | Brown, Jr. | 360/111 |
| 3,516,066 | 6/1970 | Jacoby | 328/162 |
| 3,568,174 | 3/1971 | Jacoby | 360/51 |
| 3,829,894 | 8/1974 | Watnabe et al. | 360/111 |

Primary Examiner—David Smith, Jr.
Attorney, Agent, or Firm—Burgess, Dinklage & Sprung

[57] ABSTRACT

The invention is concerned with producing interference-free (square) pulses with clean leading and trailing edges, from a pulse generator subject to vibration. This is effected by producing two interference-affected pulse trains of the same frequency but different phase, and applying them to a back-coupled gate circuit the output of which is turned "on" by the first interfering pulse of a first pulse train corresponding in time to an interference-free region of the second pulse train, and stays "on" until the end of the said interference free region, irrespective of any further interference in the first pulse sequence. The action is also repeated in reverse.

20 Claims, 25 Drawing Figures

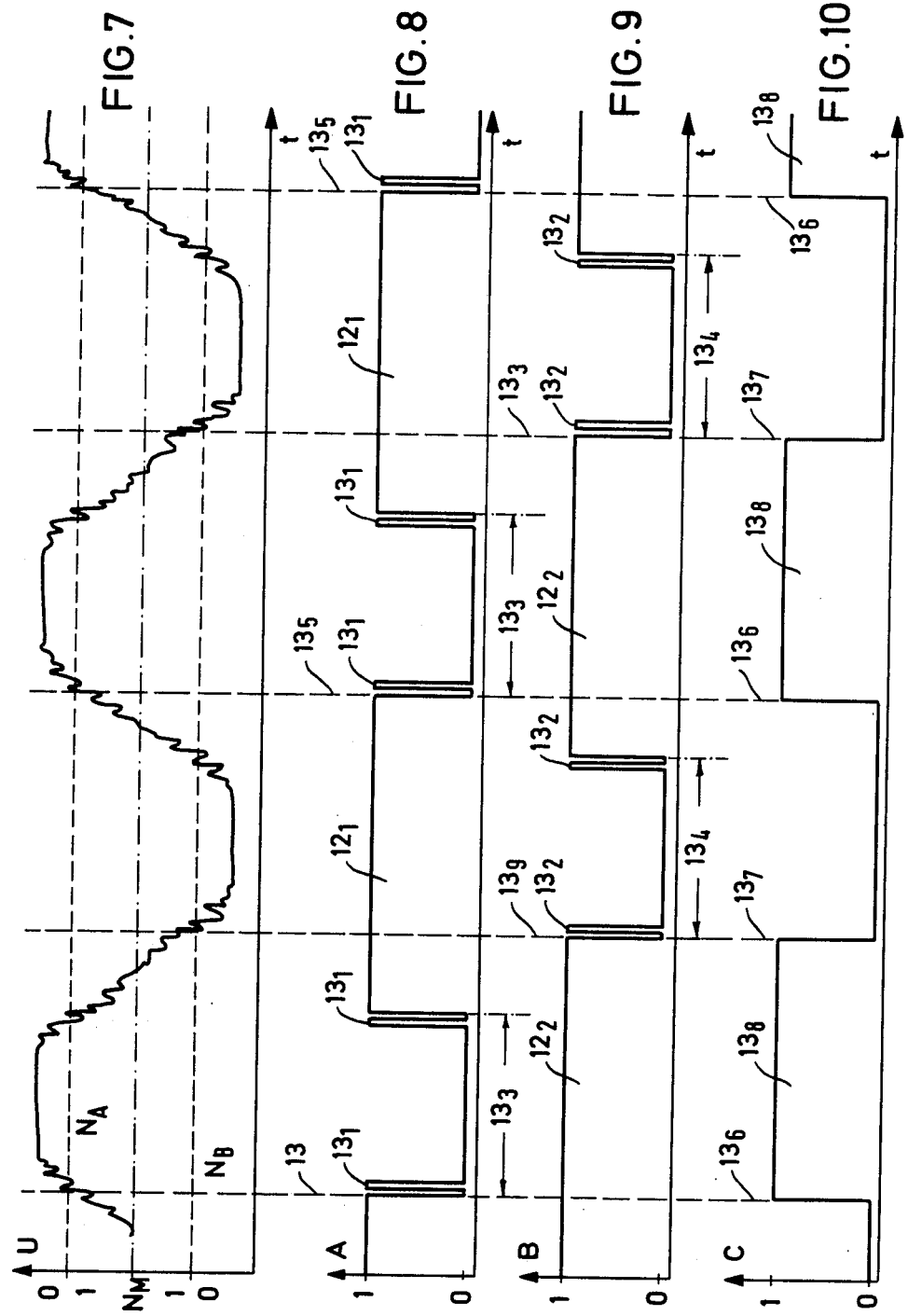

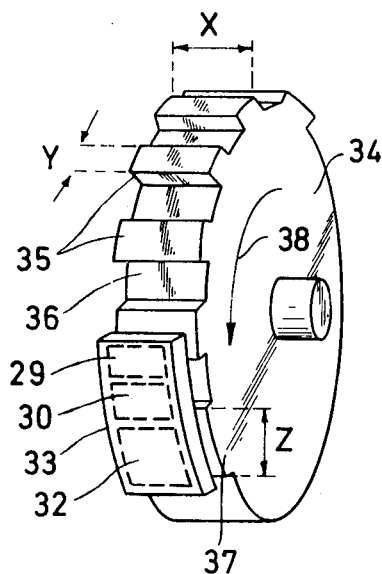
FIG. 17
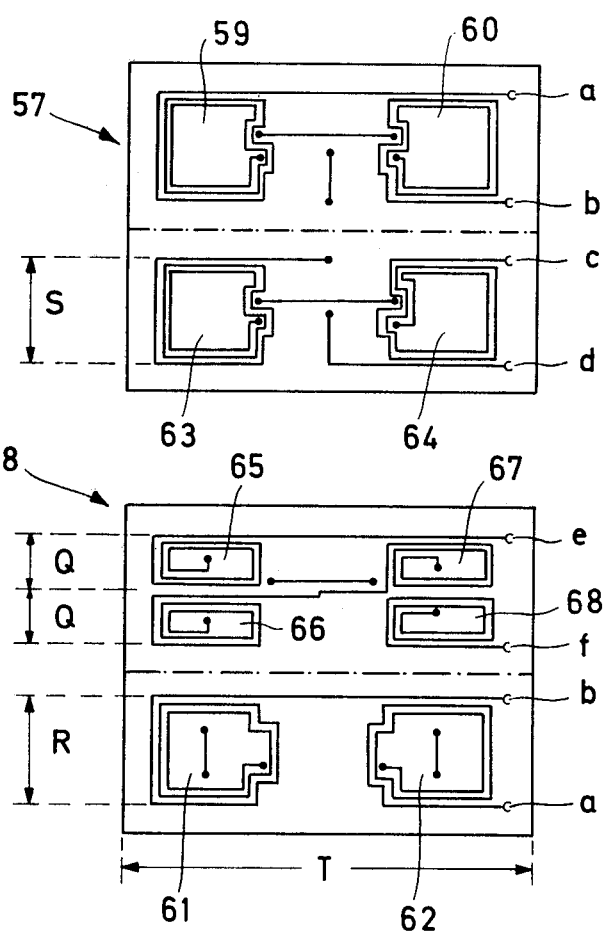
FIG. 18a
FIG. 18b

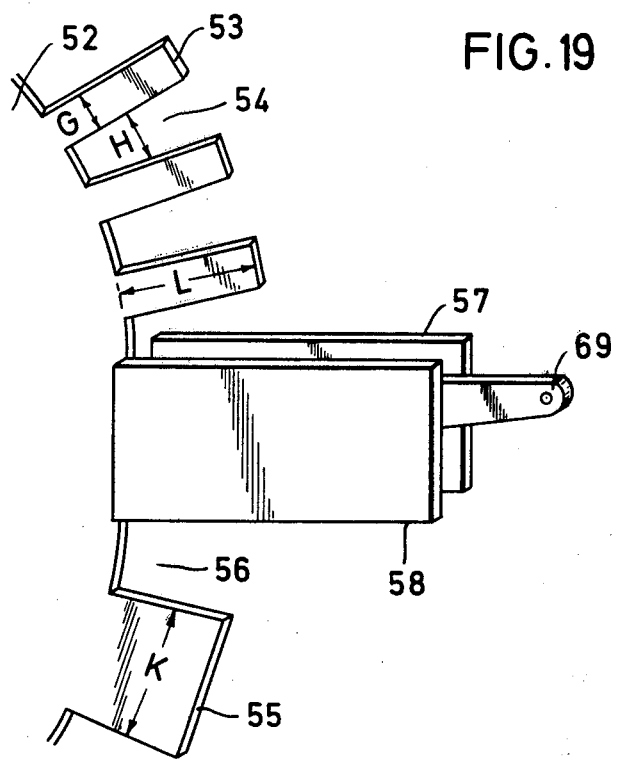

METHOD AND APPARATUS FOR PRODUCING INTERFERENCE-FREE PULSES

This is a division of application Ser. No. 418,794, filed Nov. 23, 1973 now abandoned.

The present invention concerns a method for producing interference-free pulses from relative movement between a pulse generator such as a row of teeth, and a pick-up head, and an arrangement for carrying out this method.

Very many different types of pulse generator are knwon serving to produce pulse sequences from a movement, said pulses being synchronised relatively to this movement. Such pulse sequences are used for controlling the movement or operations associated therewith. For example, pulse sequences which are derived from the crank shaft movement of an internal combustion engine may be used for controlling the ignition of the engine.

However, conventional pulse generators have the disadvantage of producing, as a result of vibrations, impacts or the like, interference pulses which are superimposed on the desired control pulses. In such cases these interference pulses may cause associated logic circuits to produce false counts, or make them completely inoperable. In addition, difficulties arise when the pulse generators are subjected to severe changes of temperature, particularly if the pulse generator and associated logic circuit are combined in one unit, so that the circuit is also subjected to severe changes of temperature; in these cases the pulse voltages change, a fact which leads to corresponding undesirable changes in the effects of the control pulses produced.

It is an object of the preset invention to avoid these difficulties and produce trains or sequences of pulses, free from interference.

According to the present invention there is therefore provided a method of producing interference-free pulses from relative movement between a pulse emitter such as a row of teeth, and a pick-up head, including producing at least two pulse sequences of the same frequency but phased in such manner that interference affected regions of one pulse sequence coincide with inteference-free free regions of the other pulse sequence and supplying both pulse sequences to a circuit the output of which is changed over at the first change of level in the interference-affected region of the first pulse sequence which occurs during the course of the overlapping interference-free region of the second pulse sequence, and is retained in this condition by the said overlapping interference-free region of the second pulse sequence.

In addition, the present invention proposes apparatus for carrying out this method which is comparatively simple to design and can be produced ecomonically with the use of standard logic circuit components and units, particularly by the use of integrate circuit technique.

According to an embodiment of the present invention there is provided an apparatus for carrying out the method described above comprising a pulse generator having a pulse emitter and at least one pick-up head, a device for the production of at least two pulse sequences of the same frequency but phased so that on the interference-affected areas of one pulse sequence, interference free areas of the other pulse sequence are superimposed, and a conversion circ coupled thereto having an input for each of the two said pulse sequences and an output, the value of which is variable at between two levels, the said circuit being controlled by the inpuse pulse sequences in such manner that the particular first change of level in the interference-affected region of the first pulse sequence which takes place in the region of the overlapping interference-free region of the second pulse sequence, effects a change in the level of the said circuit output value, and the said changed output value is maintained by the inteference-free region of the second pulse sequence irrespective of other changes of level in the interference-affected region of the first pulse sequence until the end of the said region of the second pulse sequence.

In order to produce pulses from the said movement from the impulse, induction elements are used. Among these elements all those components are to be understood as being within the scope of this invention, in which a predetermined value is changed under the influence of a magnetic and/or electro-magnetic field, even if the change in this value does not take place in each case by induction in the strictly physical sense of the word. Such induction components include for example, induction coils, field plates, Hall generators and field-effect transistors.

The above and other advantages and features of the present invention are described hereinafter with reference to embodiments illustrated in FIGS. 1 – 20 of the accompanying drawings in which:

FIG. 7 shows a series of pulses such as may be achieved in conjunction with a pick-up head according to FIG. 2;

FIGS. 8 to 10 show series of pulses derived from the series of pulses according to FIG. 7;

Figure 14:
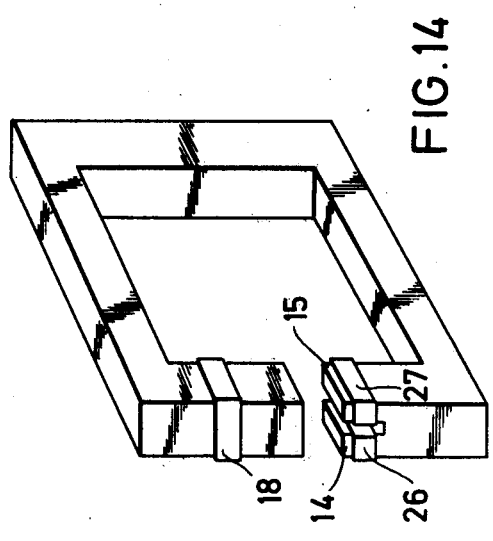
Figure 15:
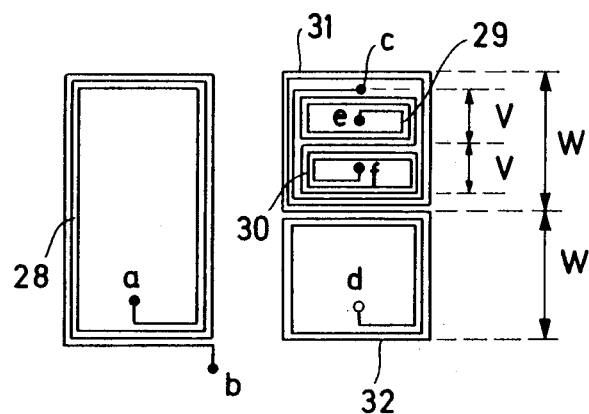
Figure 16:
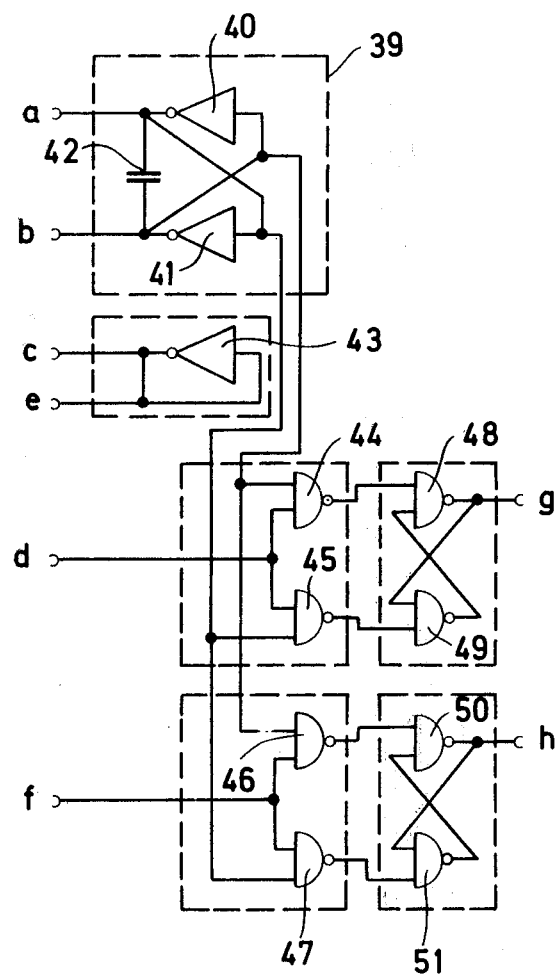
Figure 20:
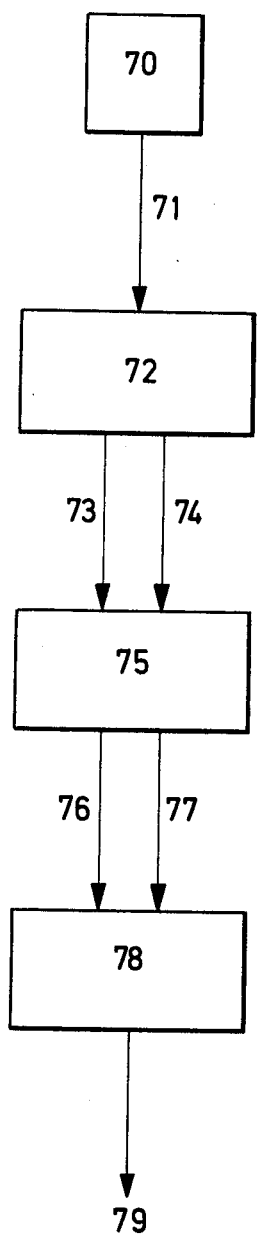

FIGS. 13a to e show a series of voltage waves to explain the mode of operation of an embodiment of the method for carrying out the invention;

FIG. 14 shows a pick-up head for carrying out a method according to the invention explained with reference to FIGS. 13a to 13e;

FIG. 15 shows coils used in another embodiment of the pulse emitter;

FIG. 16 shows a circuit for the present invention for use in conjunction with the coils of FIG. 15;

FIG. 17 shows a pulse generator capable of producing rectangular pulses in conjunction with the coils of FIG. 15 and the circuit of FIG. 16;

FIGS. 18a and 18b shows coils used in another embodiment of a pulse generator according to the present invention;

FIG. 19 shows a pulse generator, designed to use the coils of FIGS. 18a and 18b; and p FIG. 20 shows a general schematic view of the invention.

Figure 1:
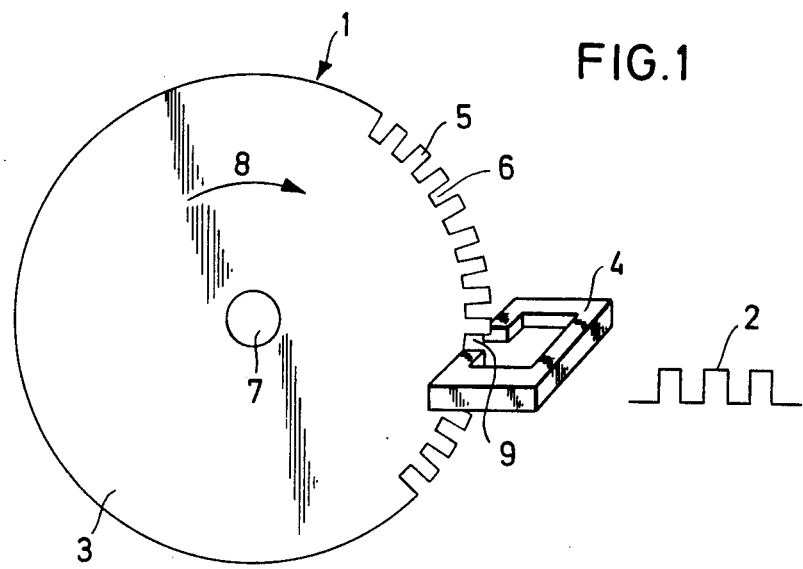
FIG. 1 shows a pulse emitter on which the present invention is based.

FIG. 1 shows a pulse generator 1 by means of which pulses 2 are produced. The pulse generator has two main parts, a mechanical pulse emitter and a pick-up head 4. The pulse emitter 3 comprises a disc on the circumference of which teeth 5 with intermediate gaps 6 are provided. The disc rotates on a spindle 7, in the direction of the arrow 8. The pick-up head 4 consists of a magnet frame or yoke having a slot 9 through which the teeth 5 and the gaps 6 pass. Mounted on one of the two poles on the magnet yoke which define the slot 9, is a field responsive device (F.R.D.) from which a voltage can be derived the amplitude of which is proportional to the magnetic flux in the slot 9. If the pulse emitter 3 consists of a material which weakens the magnetic field, a pulse 2 is produced when a gap passes through the slot 9. Conversely, a material may be used which strengthens the magnetic field so that a pulse is produced when a tooth passes through the slot 9.

Such pulse emitters are known in one form or another. They are used for producing pulses from a movement, the pulses being synchronised with the movement. For example, the movement may be the rotation of the crank shaft of an internal combustion engine, when the spindle 7 is connected to the crank shaft of the internal combustion engine, if necessary by intermediate members such as a reduction gear. The pulses 2 obtained from the pick-up head 4, are generally required for control purposes; in the case of the above-mentioned coupling of an internal combustion engine to the spindle 7, the pulses 2 may be used for controlling the ignition and/or the injection timing of the engine.

In general, rectangular pulses are required for the above-mentioned purposes. However, rectangular pulses are also required for other control purposes for which the pulse generator shown in FIG. 1 may be used. Although the pulses 2 which are produced from the F.R.D. are not per se rectangular, but may be triangular or trapezoidal, according to the ratio of the width of the gaps to the dimensions of the slot 9, the transformation of ideal triangular or trapezoidal pulses into rectangular pulses involves no real difficulties, so that for the sake of simplicity the pulses 2 in FIG. 1 are shown as rectangular pulses.

Figure 4:
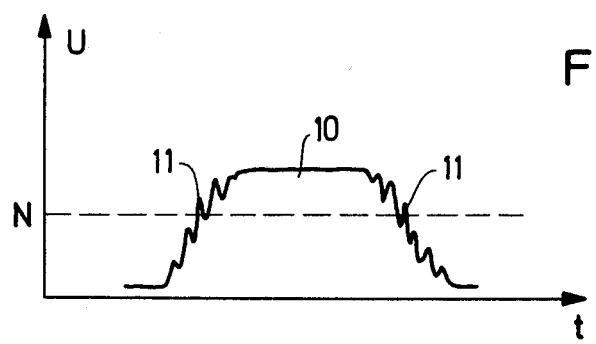
FIGS. 4 and 5 show views of the pulses produced by the pulse generator of FIG. 1.

However, there is a serious difficulty in the case of pulse generators of the type concerned because, due to vibrations of the pulse emitter 3, which may be produced, by mechanical jolts, no ideal triangular or trapezoidal pulses are really produced; on the contrary, minor interference pulses are superimposed on the major pulses, so that pulses of the type shown in FIG. 4 are derived from the output of the pick-up head 4. The figure shows the pulse voltage U to a time basis.

If, therefore, pulses of this type are to be converted into rectangular pulses by a conventional gate circuit with a response level N, the interference pulses 11 present on the leading and trailing edges of the pulse 10, the output contains not only the desired rectangular pulses 12 (See FIG. 5) but, in addition, extra rectangular inteference pulses 13. For reasons of clarity only one interfering additional pulse 13 is shown before and after the desired rectangular pulse 12. However, in reality, the interference pulses 13 may be irregular, i.e. more than one rectangular interference pulse 13 may be formed before and/or after the desired rectangular pulse 13.

As a result of these interference pulses 13 statistically associated with the desired pulses 12, serious difficulties arise if the pulses 12 are to be further processed in a logic circuit together with the inteference pulses 13, because the interference pulses 13 may actuate additional control processes in the logic circuit which are not desired, and which may prevent the logic circuit from operating as desired.

Figure 5:
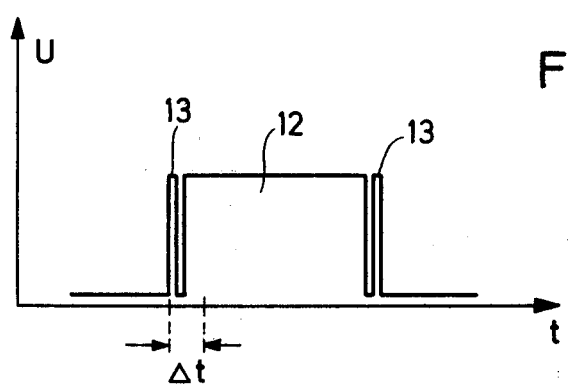

In order to surmount this difficulty, it would be possible initially to feed pulses of the type shown in FIG. 5 into a relaxation oscillator operating with a certain time delay in such manner that, after one relaxation pulse, initiation of the next one is possible only after a certain time $\Delta\ t$ has elapsed which is greater than the width of the resultant interference pulses. Such a feature leads to difficulties, however, if the pulse frequency, which is determined by the speed of rotation of the disc 3, extends over a wide range. Such a wide range is obtained in an internal combustion engine. It would then be necessary continuously to vary the time delay $\Delta\ t$ with the pulse frequency, or the time width of the desired pulse 12 to the rotational speed of the pulse emitter, a feature which would result in considerable difficulties.

Figure 2:
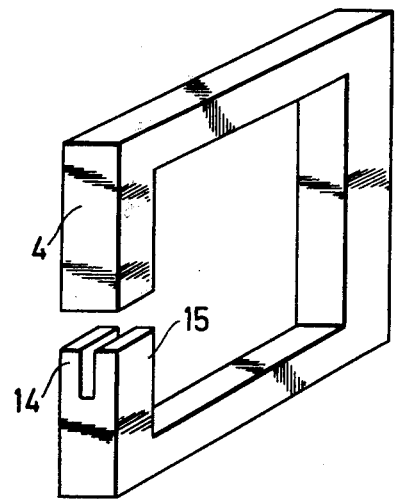
FIGS. 2 and 3 show embodiments of a pick-up head for an impulse generator of the type shown in FIG. 1.

In order to avoid these difficulties, a pick-up head of the type shown in FIG. 2 is used in which one pole of the magnet yoke 4 is divided into two smaller poles 14 and 15 extending parallel to the teeth 5 and gaps 6, the width of a gap 6 being approximately equal to the width of the poles 14 and 15 respectively. If a F.R.D. is then placed on each of the two poles 14, 15 annd if the voltages derived from opposing ends of these devices are connected in opposition to each other, a pulse sequence of the type shown in FIG. 7 is obtained, consisting of pulses according to FIG. 4, a reversed negative pulses of the same kind following a positive pulse as shown in FIG. 4. If the pulse sequence of FIG. 7 is applied to a logic circuit having two response levels $N_A$ and $N_B$ with corresponding outputs A and B, in such manner that the logic value 1 appears at the output A if the voltage U is below the level $N_A$, and the logic value 0, when the voltage is above this level, and that if the logic value 1 appears at the output B when the voltage U is above the level $N_B$, and the logic value 0 when the voltage U is below this level, then the pulse sequence of the pulses $12_1$ and $13_1$, shown in FIG. 8, is obtained at the output A, and the pulse sequence consisting of pulses $12_2$ and $13_2$ according to FIG. 9 is obtained at the output B. If these two pulse sequences having interference pulses $13_1$ and $13_2$ are fed into a logic circuit an output of which appears only when pulse $12_1$ synchronises with pulse $12_2$, irrespective of the interference pulses $13_1$ and $13_2$, then a sequence of rectangular pulses $13_8$ is obtained at the output C without interference pulses, as shown in FIG. 10.

Figure 6:
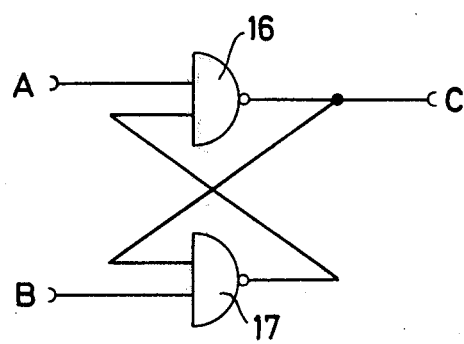
FIG. 6 shows a cicuit for transforming pulses of the type shown in FIGS. 8 and 9 into a series of identical rectangular pulses as shown in FIG. 10.

A circuit suitable for the above purpose is shown in FIG. 6. This circuit, which consists of two NAND gates 16 and 17 forming a so-called bi-stable flip-flop, has the property that, when the logic value 0 is at one input A, the logic value 1 appears at the output C, irrespective of whether the logical value 0 or 1 is at the output B, and that the logic value 0 occurs at the output C when the logical value 0 appears at the input B; also the logical value 0 or 1 appearing at the output C remains present when both inputs A and B have a logic input of 1. This produces a sequence of pulses $13_8$ at the output C without interference pulses, as may be perceived by comparing FIGS. 8, 9 and 10 which are all plotted to the same time base.

This comparison shows, as indicated by the broken lines in FIGS. 8 to 10, that the logic circuit with two inputs A and B has the property of changing its output value C in the region of a pulse $12_1$ or $12_2$ which may appear at the input A or B, only at the first change $13_5$ or $13_3$ of the signal level at the other input, as may be seen at $13_6$ or $13_7$ in FIG. 10. Since in the pulse sequences of FIGS. 8 and 9 the interference pulse ranges $13_3$ and $13_4$ of the pulse sequence at the input A or the pulse sequence at the input B always overlap the wide pulses $12_2$ and $12_1$ respectively of the other of these two pulse sequences, no other changes of level can be caused by interference pulses, as long as a wide pulse $12_2$ or $12_1$ of the other of the two pulse sequences continues.

Although this solution of the above problem is sufficient for a number of possible uses, a new problem arises in cases in which the pulse generator, and more particularly, the logic circuit associated therewith, are subjected to severe changes of temperature. This is the case, for example, when the pick-up head and the circuits necessary for processing pulses and designed in an integrated form, are combined into a compact unit and mounted at a place subjected to severe temperature fluctuations; such a place is, for example, the immediate neighborhood of an internal combustion engine, the ignition of which is to be controlled by means of the pulse generator of the invention. However, many other cases are possible in which the pick-up head and the circuits combined therewith are exposed to considerable temperature fluctuations, as in the control of chemical reactions, particularly in large scale processing installations and in the meteorological or space stations.

In such cases in which severe temperature fluctuations occur, serious difficulties arise due to the temperature-conditioned changed in the levels $N_A$ and $N_B$ (FIG. 7) because these levels shift as a result of temperature-produced change in the properties of the gate elements (semi-conductors). Furthermore, this shifting of level does not occur symmetrically about the middle level $N_M$ of the pulse sequence of FIG. 7, which is shown chain-dotted in the above figure. On the contrary, both response levels $N_A$ and $N_B$ move simultaneously in the direction of increasing or decreasing operating voltage with a temperature change (i.e. the level $N_A$ moves downwardly or upwardly simultaneously with the lvel $N_B$ relatively to FIG. 7, i.e. not symmetrically with the level $N_M$) provided it is desired to use standard gates, a feature which is very desirable.

It should be pointed out that it would be within the scope of the present invention if the two pulse sequences of FIG. 8 and FIG. 9 were produced by separate pick-ups from one of the F.R.D.s disposed on the poles 14 and 15, with subsequence conversion into rectangular pulses. A common response level would then be obtained, but the relative changes of voltage occurring in the pick-up head during the production of pulses would be comparatively small, e.g. 5% of the basic voltage, a feature which would lead to considerable difficulties with regard to the operating level. This basic voltage is compensated precisely by the opposition of the voltages produced by the F.R.D.s.

The above difficulties, described with reference to FIG. 7, may be surmounted if the magnetic field is modulated with a carrier frequency which is much higher than the pulse frequency. Then, instead of the pulses shown in FIG. 7, carrier frequency modulated pulses are obtained of the type shown in FIG. 11. In the case of these carrier frequency-modulated pulses, a single gate response level is sufficient, so that the above problem of symmetry disappears. However, in using only this single response level, only one pulse series with interference pulses would be obtained which could not be transformed into a pulse series without inteference pulses according to FIG. 10, in the manner described with reference to FIGS. 6, 8, 9 and 10.

The division into two pulse sequences according to FIGS. 8 and 9, is, however easily possible when using modulation by a carrier frequency in conjunction with the opposed connection of the voltages obtained in the F.R.D.s 14 and 15 (FIG. 2) in the manner described hereinafter, for which purpose the carrier frequency voltage, modulated by the pulses 10 according to FIG. 4, is to be considered in greater detail with refernece to FIGS. 13a to 13e, in conjunction with FIG. 3.

Figure 3:
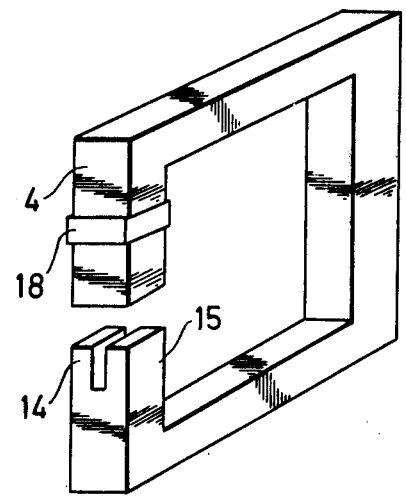
Figure 13A:
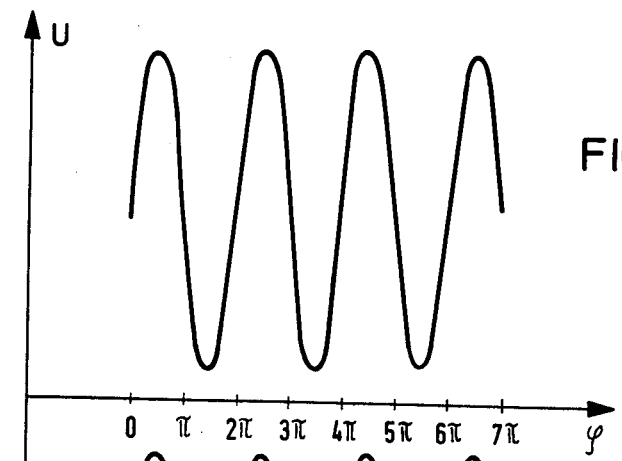
Figure 13B:
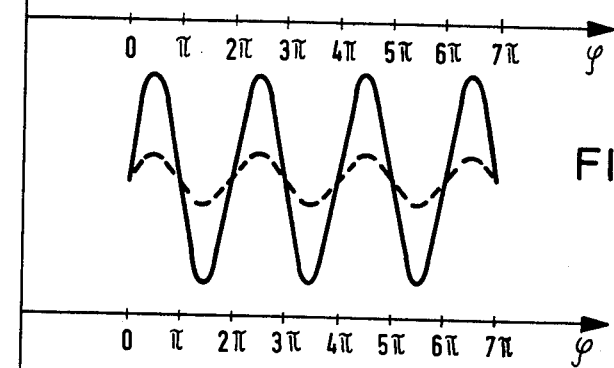

The modulation applied to the field of the magnet yoke 4 in FIG. 3 by means of the coil 18, is shown in FIG. 13a, as a simple sinusoidal curve of a predetermined frequency, preferably between 1 and 20 MHz. Starting from the beginning of any positive half-wave, the phases are given on the abscissa. If the teeth 5 consist of a material weakening the field then if the F.R.D. mounted on the pole 14 (FIG. 3) is disposed near a gap 6 (FIG. 1), a voltage is induced between its ends, said voltage being represented by the sinusoidal wave of FIG. 13b shown in a full line; this voltage is in phase with the sinusoidal curve of FIG. 13a. The same voltage is in principle induced as in FIG. 13b between the ends of the other F.R.D. which is mounted on the pole 15, but because of the opposed connection of the voltage obtained in the two F.R.D.s the voltage in the second F.R.D. is of opposite polarity, since, when the two F.R.D.s are in opposition to each other, the voltages produced therein operate against each other, ie. cancel each other to zero. The voltage produced in the F.R.D. associated with the pole 15 should therefore be reversed on account of its opposed connection, so that the voltage obtained is according to FIG. 13c, relatively to the F.R.D. associated with the pole 14, when the pole 15 is in the region of a gap 6, represented by the full sinusoidal line. If one of the two F.R.D.s 14 or 15 is covered by a tooth 5, then the voltage produced in the said one F.R.D. is greatly weakened, a feature which results in a voltage shown in broken lines in FIG. 13b and 13c. If, furthermore, the width of a tooth or gap is selected so that only one of the two poles 14, 15, is covered by a tooth 5, whilst at the same time the other of the two poles is in the region of a gap 6, then the voltage in one F.R.D. remains unweakened, whilst the voltage produced in the other is weakened by the tooth over it, and conversely. This results in the following.

Figure 13C:
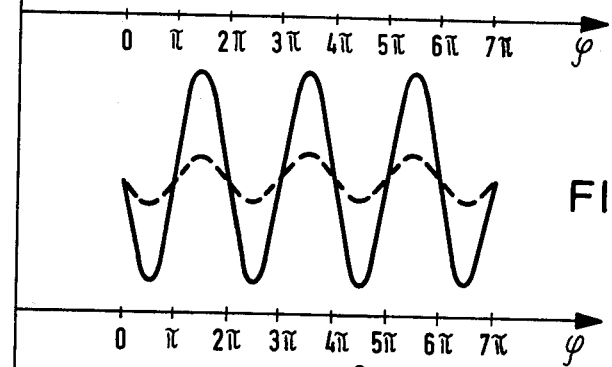
Figure 13D:
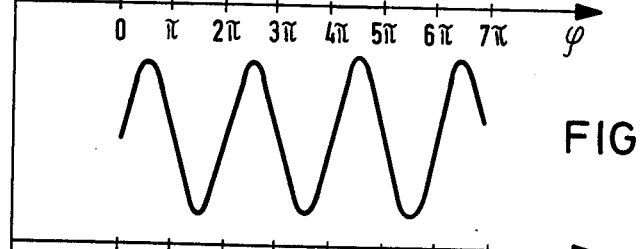

Let it be assumed that a gap lies before the pole 14 and a tooth before the pole 15. Then the voltage shown in full lines in FIG. 13b is to be added to the voltage shown in FIG. 13c in a booken line so that a total or resultant voltage according to FIG. 13d is obtained, having the same phrase as the voltage of 13a and 13b.

Figure 13E:
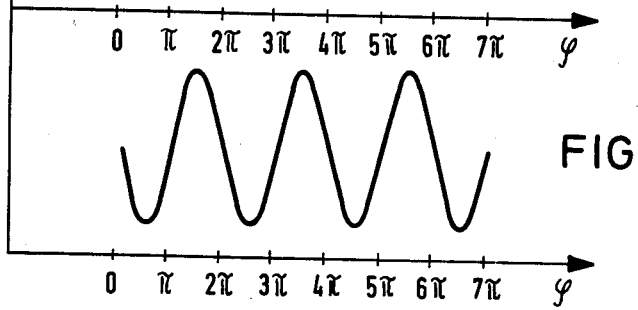

Let it now be assumed, that conversely, a tooth is disposed in front of the pole 14 and a gap in front of the pole 15. Then the voltage shown in a full line in FIGS. 13c is to be added to the voltage shown in a broken line in FIG. 13c, so that a voltage according to FIG. 13e is obtained which is phase-shifted through 180° relatively to the voltage according to FIG. 13d and the voltage according to 13a.

Figure 11:
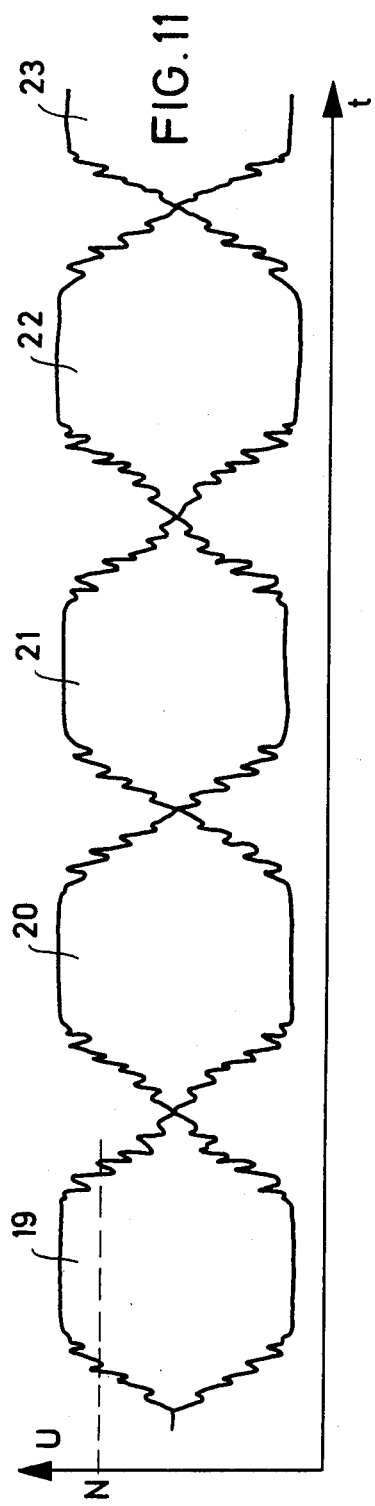
FIG. 11 shows a series of pulse such as may be obtained with the use of a pick-up head according to FIG. 3.

The above circumstances, mean, however, that the carrier frequnecy voltages of adjacent pulses 19 – 23 of FIG. 11 are always relatively disposed by 180°. For example, if the carrier frequency voltage of the pulse 19 has the phase of FIG. 13d relatively to the energising voltage of FIG. 13a, i.e. it is in phase with the energising voltage then the carrier frequency voltage of pulse 20 has the phase of FIG. 13e relatively to the energising voltage of FIG. 13a, i.e. it is phase-shifted through 180°. The voltage of pulse 21 is also in phase with the energising or modulating voltage of FIG. 13a and the voltage of the pulse of FIG. 22 is again phase-shifted through 180° relatively thereto, and so on.

Figure 12:
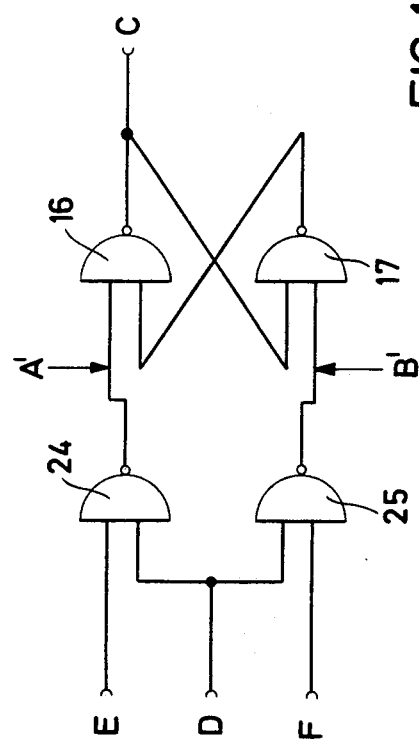
FIG. 12 shows a circuit arrangement for further processing the pulse sequence of FIG. 11.

If, the, the pulses of FIG. 11, modulated at the carrier frequency voltage, are fed into the input D of a circuit according to FIG. 12, whilst the input E receives a carrier voltage and the input F with a carrier voltage shifted through 180°, then pulse series according to FIGS. 8 and 9 are received at the points A' and B', which pulses are then transformed into the pulse sequence of FIG. 10 in the second part of the circuit of FIG. 12 which is identical with the circuit of FIG. 6. It is also necessary in this connection to give the NAND gates 24, 25 a response level which corresponds to the level $N_A$ of FIG. 7.

The left-hand part of the circuit of FIG. 12 therefore sorts out the pulses of the sequence of FIG. 11 according to the phase position of the carrier frequency voltage relatively to the energising voltage into two pulse sequences, one of which corresponds to the pulses above and the other to the pulses below the level $N_M$ of FIG. 7. At the same time, however, due to the setting of a response level for both gates 24 and 25, the transformation of these pulse sequences into pulse sequences according to FIGS. 8 and 9 takes place, so that the above-mentioned upper two pulse sequences are only imaginary sequences. Naturally, it is however, also possible to separate the last two steps from each other so that the former two pulse sequences would really appear; this separation would, however, be much more complicated from the circuit point of view.

The principle of the present invention may not only be used in the case of its application to F.R.D.s in order to reduce voltage, but is also suitable for producing a voltage by the use of coils or other means. A simple embodiment of a pick-up head is shown in FIG. 14 in which the magnet yoke carries on one side a coil 18 which is fed with the modulation voltage, whilst the two poles 14 and 15 carry respective coils 26 and 27 which are connected oppositely to each other so that a resulting voltage U is obtained of the type shown in FIG. 11.

It is possible, if additional auxiliary pulses or other sequences of rectangular pulses are required, in addition to the sequence shown in FIG. 10, to provide several pairs of coils 26, 27 and other field-controlled components, the effective coil surface and the field surface of the various pairs of coils and the field-controlled components being different, if desired.

In those cases in which auxiliary pulses are to be added to a sequence of rectangular pulses at a separate output, without undesirable interference with the production of the auxiliary pulse occurring at the output at which the sequence of rectangular pulses appears. This can be achieved by appropriate location of the effective winding surfaces of the individual coils and the effective surfaces of the field components relatively to each other and relatively to the width of the gaps and teeth of the pulse emitter, as described hereinafter in greater detail with reference to the embodiments of FIGS. 15-19.

FIG. 15 shows an operating coil 28 with connections a and b which are connected to a high frequency voltage as shown in FIG. 13a; this coil corresponds to the operating coil 18 in FIG. 14. Furthermore, a pair of coils is shown comprising the coils 29 and 30 each of which has an effective winding width V and is connected oppositely to the other, so that together they have two terminals e and f, from which a pulse sequence of the type shown in FIG. 11 can be derived; this pair of coils corresponds to the coils 26 and 27 of FIG. 14.

In addition, another pair of coils 31 and 32 is provided, each of which has an effective winding width W and which are also connected oppositely to each other so that pulses of the type of FIG. 11 also modulated with a carrier frequency voltage according to FIG. 13a can be derived from the remaining terminals c and d.

The coil 28 is located close to the coils 29–32 to form an apparatus 33 which is shown in FIG. 17. This apparatus correspond to the pick-up head 4 in FIG. 1 and co-operates with a pulse emitter 34. The pulse emitter 34 has the shape of a wheel provided on its circumference with teeth 35 and gaps 36; said teeth may consist of ferro-magnetic material. The coils 28–32 are aligned as shown by broken lines in FIG. 17, i.e. the width extension V or W of the coils 29 – 32 is parallel to the width Y or Z of the teeth 35 or 37. The operating coil 28, which coincides geometrically with the coil system 29–32, is preferably disposed on the side of the coil system 33 remote from the teeth. As the teeth pass by, the magnetic field is intensified so that corresponding voltages can be induced in the coils 29 – 32. Whether carrier frequency modulated pulses of the type of FIG. 11 appear at the terminals e, f, of the oppositely connected coils 29 and 30 or the terminals c, d of the oppositely connected coils 31 and 32, depends, on the ratio of the effective winding widths V or W to the effective tooth width Y and Z (these are to a certain extent the conditions for whether a tooth or a gap is "perceived" by the coils or field-controlled components, i.e. whether it results in the production of a voltage reaching the response threshold of the associated circuit on the terminals e, f and c, d of the oppositely connected coils or field-controlled components), as may be perceived from the following consideration.

If it is assumed that the width Y of the teeth 35, which should be equal to the width of the gaps 36, is much less than the width V of the coils 29 and 30, then, in each position of the pulse emitter 34, the same total width of teeth and gaps exist always before each individual coil 29 and 30, so that the voltages induced in both coils rise on account of the opposed connection of the other coils, i.e. no resultant total voltage appears at the terminals e, f. This changes only if the width of the teeth and gaps is of the order of magnitude of the width V of an individual coil 29 or 30 or becomes greater, when the possibility arises that a greater tooth width is disposed before one of the two coils 29 and 30 than before the other of the two coils. Therefore, in order to produce pulse sequences, the effective tooth or gap width is preferably greater than half the effective coil width and less than double thereof.

The width of the teeth 35 and the gaps 36 is preferably equal or approximately equal to the effective width V of the coils 29 and 30 in order to achieve effective induction of a pulse sequence.

If it is desired to produce auxiliary pulses in the pair of coils consisting of the coils 31 and 32, with the same pulse emitter 34, without pulses being produced therein by the teeth 35, then the widths W of these coils is selected to be at least twice the width Y of the teeth 35, and the same effective tooth width is always disposed before each of the two coils 31, 32 so that no pulses occur at terminals c, d on account of the opposed connection of the coils, whilst the teeth 35 pass by the coils 31, 32 but simultaneously pulses appear on the connections e, f of the coils 29, 30. Only when a tooth 37 of comparatively large width passes by the coils 31, 32, for example, of a width Z which is equal to the width W, does a voltage appear at the terminals c, d. If the pulse emitter 34 passes the coils 31, 32 (beginning with the gas field in front of the tooth 37) in the direction of the arrow 38, then two carrier-frequency-modulated pulses of the type 19, 20 of FIG. 11 occur at the terminals c, d, but the second of these two pulses will have a lesser height than the first, because, when the tooth 37 passes the coil 32, no full gap is disposed in front of the coil 31. However, the teeth 35 then produce no further resilient voltage for the above reasons, but they cause a pulse sequence of the type of FIG. 11 to appear at the terminals e, f of the coils 29, 30. In this manner auxiliary pulses may be produced for additional control purposes.

FIG. 16 shows the circuit which is connected to the connections a – f of the coils 28–32 in order to obtain rectangular pulses, the points being indicated in FIG. 16 by the reference letters to which the individual terminals of the coils 28–32 are connected. The circuit for producing the carrier voltage is indicated by 39 which is preferably fully integrated with components of the 54 series. The carrier voltage of approximately 1–20 MHz is produced by means of crosswise-connected inverters 40 and 41. The capacitor 42 serves to suppress harmonic vibrations. The high frequency earthing point of the induction coils 29–32 is connected to an oppositely coupled inverter 43, the output voltage of which is below the threshold value of the NAND gates 44, 45, 46 and 47. The output voltage has the same temperature behaviour as these gates, so that compensation of temperature drift of the threshold value voltage N (See FIG. 11) is effected. In the NAND gates 44, 45 the induced voltage, which is derived from the coils 31, 32 is sorted out according to phase relatively to the phase of the generator 32 and turned into impulses by the threshold value of these gates. The NAND gates 46 and 47 act similarly on the voltage induced in the coils 29 and 30. The outputs of the NAND gates 44, 45, and 46, 47 are fed to the inputs of the NAND gates 48, 49 and 50, 51 connected as bi-stable flip-flops, so that rectangular pulses are produced at the output terminals g, h (compare the comments on FIG. 2).

Another embodiment of the present invention is shown in FIGS. 18a, 18b and 19. The pulse generator shown in FIG. 19 comprises an aluminum disc 52 coupled to the shaft of an internal combustion engine and provided on its circumference with teeth 53 of width G. The teeth 53 in this embodiment are separated by gaps 54 of the same width H, with the exception of one point where a tooth 55 and a gap 56 are provided, the width K of which amounts in each case to three times the normal width G and H respectively. The teeth pass between the plates 57, 58 of the pickup head. These plates are shown in FIGS. 18a and 18b, opened along the centre line of a longitudinal edge. They carry operating and generator coils 59, 60, 61 and 62 and two groups of induction coils of different widths, the effective winding surfaces of which are located opposite the effective winding surfaces of the operating and generator coils on the other side of the plate. One group of induction coils is formed by the oppositely connected coils 63 and 64 located on the plate 57; the other group of induction coils comprises the coils 65, 66, 67 and 68 which have less width Q than the width S of the first induction coils; preferably S is equal to 20. The width R of the operating or generator coils 59 to 62 is preferably equal to the width S.

The operating or generator coils 59 to 62 are connected in the same sense, whilst, as already mentioned, the induction coils 63 and 64 are connected in series opposition; the pairs of induction coils 65, 66 and 66, 67 as also 67, 68 are also connected in series opposition.

The operating coils 59 to 62 and the induction coils are printed as conductor paths on the plates 57 and 58. The operating coils 59 – 62 are mounted on the sides of the plates 57 and 58 which are remote from the teeth passing through them, i.e. on the outsides. The induction coils 63 – 68 are disposed on the sides of the plates 57 and 58 facing the passing teeth. The small dots or circles are through connection points which are provided to avoid cross-overs of the conductor paths on the same side of the plate, and are commonly known in printed circuits.

The width Q of the induction coils 65 – 68 is preferably equal to the width G or H of the teeth 53 or the gaps 54. The height L of the teeth 53 and 55 amounts to approximately only half the length T of the plates 57, 58, and the plates are so mounted that the teeth pass only through one longitudinal half of the plates, i.e. only through the effective winding cross-sections of the coils 59, 61, 63, 65 and 66. As the teeth and gaps pass through the side portions of the effective winding cross-sections of the last-mentioned coils, the voltages induced in the induction coils change in phase and amplitude as described above. The coils 59 – 68 are connected to the circuit shown in FIG. 16, the terminals provided with the same reference letters being connected together.

Compared with the embodiment shown in FIGS. 15 and 17, the following features are associated with the induction coils.

One point resides in the feature that, in addition to the series-connected induction coils 65 and 66, through which the teeth and gaps pass and which therefore in principle correspond to the induction coils 29 and 30 in FIG. 15, other induction coils 67, 68 are provided which are outside the area through which the teeth pass and are connected oppositely to each other and the induction coils 65, 66 as already described above. When there are no teeth in the vicinity of the induction coils 65, 66 and no corresponding material exists in the effective range of the induction coils 67, 68, the voltages in the coils compensate each other and the output voltage at the terminals e, f is zero. When under the above-preconditions, teeth of the width Q pass through the effective areas of the induction coils 65 and 66, then the same output voltages are obtained as in the case of the coils 29 and 30 of FIG. 15 because the voltages induced in the induction coils 67 and 68 cancel each other. However, it is possible to provide a piece of material in the vicinity of the induction coils 67, 68 to represent a kind of "adjusting tooth" which can be set in a fixed position and by the adjustment of which the amplitude and phase of the voltage appearing at the terminals e, f can be changed to set. Thus any necessary adjustments of the voltage can be made which, as they are effected with additional components, such as the above-mentioned "adjusting tooth," be termed independent or separate adjustments. Naturally, a dynamic separate adjustment is also possible in which the adjusting component is not fixed, but has its position controlled by another mechanical value. For example, the adjusting component may be moved by a motor.

The second point resides in the feature that in the case of the wider induction coils, only one is arranged in the vicinity of the passing teeth and not two coils of this type connected in opposite direction, such as the coils 31 and 32 of FIG. 15. Although another induction coil 64 connected oppositely to the induction coil 63 is provided, and of the same value, it is disposed outside the area of the teeth — it therefore corresponds to the induction coils 67, 68 of FIG. 18b provided for the adjustment. This means that the voltage applied ato the terminals *c, d* of the induction coils 63, 64 always has the same phase, which can be changed, however, as well as the amplitude, by a corresponding adjusting tooth, similarly to the case of the coils 67, 68. FIG. 19 shows an adjusting tooth 69.

This possibility of providing only one coil 63 of greater width near the passing teeth exists when only one or few auxiliary pulses are required.

The present invention is obviously not limited to the described embodiments. For example, it is also possible to use, instead of a bi-stable flip-flop, a scanned JK flip-flop or any other suitable logic circuit, although the bistable flip-flop is particularly suitable because of its simplicity. Furthermore, the entire control logic system of FIG. 12 can be achieved by a JK flip-flop, the J, K inputs corresponding to the inputs E and F, and the synchronous input CK corresponding to the input D of FIG. 12. If symmetrical operation through the J, K inputs is omitted, a D type flip-flop may also be used.

A few features of the present invention are now briefly summarised with reference to FIG. 20 and, in connection therewith, the terminology is described in greater detail as used for the various pulse sequences occurring necessarily or optionally in the specification.

FIG. 20 shows a comprehensive block circuit diagram of a device according to the present invention comprising a pulse generator with pickup head 70 from which a pulse sequence modulated by the carrier frequency, of the type shown basically in FIG. 11, is derived from the oppositely connected induction components; such a pulse sequence is termed "an initial pulse sequence."

If this pulse sequence in a circuit 72 is divided into two pulse sequences 73, 74 according to the phase of the carrier frequency voltage in the individual pulses 19, 20, 21, etc. (FIG. 11), then these two pulse sequences 73, 74 are termed "output pulse sequences;" however, it should be pointed out that if a carrier frequency is not employed, pulse sequences consisting of pulses shown basically in FIG. 4 (such as can, for example, be picked up directly from both F.R.D.s on the poles 14, 15 in FIG. 2) have also been termed output pulse sequences. The pulse rises and the sequences have also been termed "output pulse sequences."

If the output pulse sequences 73, 74 are transformed by means of a suitable circuit 75 into rectangular pulses 76, 77 of the type shown basically in FIGS. 8 and 9, then the latter are called "intermediate pulse sequences" from which the desired interference-free pulses 79, as shown in principle in FIG. 10, are finally obtained by a circuit 78 (e.g. as in FIG. 6).

As may be seen, the intermediate pulse sequences are formed in a phase-correct sorting-out of the pulses of the initial pulse sequence 71 and with simultaneous conversion into rectangular pulses by a circuit on the left of FIG. 12, (combining circuits 72 and 75), directly at the points A' and B'. On the other hand, as stated above, if a carrier frequency is not used for field modulation, the output pulse sequences can be directly taken from the pickup head.

The designation given to the particular pulse sequences therefore characterises their basis structure in the above sense. As stated in the description, the principle of FIG. 20 may be applied many times to produce a plurality of adjacent pulse sequences, preferably synchronised with each other. The pulses of these various pulse sequences, if only two pulse sequences are concerned are termed "main" and "auxiliary" pulses, the sequence of the auxiliary pulses, if desired, also comprising only one pulse per sequence of the main pulses.

I claim:

1. Method of inductively producing interference-free electrical pulses comprising the following steps:
    a. strengthening or weakening periodically the flux of a magnetic field within a gap by moving past or through said magnetic field a member of a material which is able to strengthen or weaken a magnetic field,
    b. modulating said magnetic field within said gap with a carrier frequency voltage,
    c. inducing a voltage in each of at least two induction elements by said magnetic field so that said voltage in each of said induction elements has a frequency being identical with said carrier frequency and has an amount which varies according to the variations of said magnetic field caused by said member, said voltages further being phase shifted relative to each other due to spatial displacement of said two induction elements relative to each other in the direction of the movement of said member,
    d. comparing the phase of the voltage difference of said two voltages with the phase of said carrier frequency voltage so that there are by phase sorting obtained two pulse sequences which are synchronized relative to each other such that the interference-affected regions of one of said pulse sequences occur at the same time as interference-free regions of the other of said pulse sequences, and vice versa,
    e. and controlling by said pulse sequences the level of an output value which is variable between two levels, said controlling is made such that the first change of level in an interference-affected region of one of said pulse sequences which takes place during an interference-free region of the other of said pulse sequences effects a change in the level of that output value, and said changed output value is maintained during the interference-free region of said other pulse sequence irrespectively of other changes of level in the interference-affected region of said one pulse sequence, and vice versa.

2. A method as recited in claim 1, including transforming the initial pulses from said induction elements and modulated by said carrier frequency into retangular pulse sequences (intermediate pulse sequences) simultaneously with said sorting operation.

3. A method as recited in claim 2, including using the response level of a relaxation oscillator in said conversion into rectangular pulse sequences (intermediate pulse sequences), so that a region of said first rectangular pulse sequence including narrow rectangular interference pulses is overlapped by a region of said second rectangular pulse sequence free of rectangular interference pulses.

4. A method as recited in claim 3, including feeding both rectangular pulse frequencies (intermediate pulse sequences) of said relaxation oscillator, to both inputs of an RS flip-flop, from the output of which said interference-free pulses are derived.

5. A method as recited in claim 1 wherein in addition to the interference-free pulses (main pulse sequences) other pulses (auxiliary pulses) of the same frequency are produced by means of additional induction elements.

6. A method as recited in claim 5 wherein the dimensions of said pulse emitter members, and of said induction elements for the production of the auxiliary pulses are selected relatively to the dimension of said pulse emitter members, that no total voltage reaching the response threshold of said associated circuit is produced by said pulse emitter components for said main pulse sequences in the pair of induction elements for the production of said auxiliary pulses.

7. Apparatus for inductively producing interference-free electrical pulses comprising:
 a. a pulse generator having a mechanically driven member which is able to strengthen or to weaken periodically a magnetic field,
 b. at least one pick-up head having a gap with a magnetic field the flux of which is strengthened or weakened periodically by said member,
 c. a device for modulating the magnetic field within said gap with a carrier frequency,
 d. at least two induction elements in said pick-up head, said induction elements being arranged within said magnetic field so that a voltage is inducted in each of said induction elements having a frequency being identical with said carrier frequency and having an amount varying according to the variations of said magnetic field caused by said member, said induction elements being further displaced relative to each other in the direction of the movement of said member so that said voltage being produced in one of said induction elements is phase shifted relative to said voltage being produced in the other of said induction elements,
 e. a device for phase comparison between the phase of the voltage difference of the voltages produced in said induction elements and the phase of the voltage of said modulating device so that there are by phase sorting obtained at least two pulse sequences which are synchronized relative to each other such that the interference-affected regions of one of said pulse sequences are occurring at the same time as interference-free regions of the other of said pulse sequences, and vice versa,
 f. and a control device having an input for each of said pulse sequences and an output the value of which is variable between two levels, said control device being controlled by said pulse sequences such that the first change of level in the interference-affected region of one of said pulse sequences which takes place during an interference-free region of the other of said pulse sequences effects a change in the level of said output value, and said changed output value is maintained during the interference-free region of said other pulse sequence irrespectively of other changes of level in the interference-affected region of said one pulse sequence, and vice versa.

8. Apparatus as recited in claim 7, including a device for converting said pulses sorted into phases, into rectangular pulse sequences (intermediate pulse sequences).

9. Apparatus as recited in claim 7 characterized in that said means for sorting out into phases and said device for converting said pulses sorted into phases, into rectangular pulse sequences is a back-coupled gate circuit.

10. Apparatus as recited in claim 9, characterized in that said gate circuit has an RS flip-flop associated with it.

11. Apparatus as recited in claim 9, characterized in that said means and device for sorting out into phases and simultaneous conversion of said pulses into rectangular pulse sequences respectively each comprise two parallel operating NAND gates, and to each input (D) of each NAND gate, said pulses (initial pulse sequence) occurring at the output of said oppositely connected induction elements, and to both of other inputs (E, F) of said NAND gates, said carrier frequency voltage of said device for modulating said field is applied, one being, in phase and, the other, phase-shifted through 180°.

12. Apparatus as recited in claim 11, characterized in that both outputs (A', B') of said NAND gates are connected to the inputs (A, B) of an RS flip-flop.

13. Apparatus as recited in claim 7 characterized by additional induction elements and circuit means associated therewith for producing auxiliary pulses and for the adjustment of the induced carrier frequency voltages in phase or amplitude.

14. Apparatus as claimed in claim 13, characterized in that the dimensions of said pulse emitter members for producing said auxiliary pulses are at least twice as much as the dimensions of said pulse emitter members for producing said other pulses (main pulses).

15. Apparatus as recited in claim 13, characterized in that the dimensions of said induction elements for producing said auxiliary pulses is at least twice as much as the dimensions of said induction elements for the production of said original pulses.

16. Apparatus as recited in claim 14, characterized in that said tooth and gap width amount respectively to less than double and more than half of said effective widths (W. S, V,Q) of said associated elements, i.e., $$\tfrac{1}{2} W < Z < 2 w \text{ or } \tfrac{1}{2} S < K < 2 S \text{ or}$$

$$\tfrac{1}{2} V < Y < 2 V \text{ or } \tfrac{1}{2} Q < G < 2 Q \text{ or}$$

$$\tfrac{1}{2} Q < H < 2 Q.$$

17. Apparatus as recited in claim 16, characterized in that said tooth and gap widths (Z, K; Y, G, H) are respectively equal to the effective widths (W, S; V, Q) of said associated induction elements, i.e., $Z = W$ or $K = S$ or $V = Y$ or $G = H = Q$.

18. Apparatus as recited in claim 13, characterized in that said induction elements serving to produce said main pulses are inserted in the effective surface of at least one of said induction elements for the production of the auxiliary pulses.

19. Apparatus as recited in claim 7 characterized in that additional induction elements disposed outside the area of said field and connected in series opposition to the latter and having adjusting means, are associated said induction elements provided in the region of said field.

20. Apparatus as recited in claim 7 including means for compensating the temperature drift of at lease said active circuit components.

* * * * *